United States Patent
Hsu et al.

(10) Patent No.: US 8,686,756 B2
(45) Date of Patent: Apr. 1, 2014

(54) TIME-TO-DIGITAL CONVERTER AND DIGITAL-CONTROLLED CLOCK GENERATOR AND ALL-DIGITAL CLOCK GENERATOR

(75) Inventors: Terng-Yin Hsu, Hsinchu (TW); Yuan-Te Liao, Hsinchu (TW); Kai-Shu Su, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/570,104

(22) Filed: Aug. 8, 2012

(65) Prior Publication Data

US 2013/0038349 A1 Feb. 14, 2013

(51) Int. Cl.
| H03K 19/00 | (2006.01) |
| H03K 19/096 | (2006.01) |
| H03K 7/08 | (2006.01) |
| H03L 7/06 | (2006.01) |

(52) U.S. Cl.
USPC .............. 326/93; 327/158; 327/176; 375/376

(58) Field of Classification Search
USPC .............. 326/93, 95; 327/158, 175, 176, 228, 327/276, 278, 376
See application file for complete search history.

(56) References Cited

U.S. PATENT DOCUMENTS

| 5,570,294 | A | * | 10/1996 | McMinn et al. | 702/118 |
| 6,069,508 | A | * | 5/2000 | Takai | 327/161 |
| 6,154,079 | A | * | 11/2000 | Lee et al. | 327/276 |
| 7,786,913 | B2 | * | 8/2010 | Waheed et al. | 341/143 |
| 2009/0175399 | A1 | * | 7/2009 | Sun et al. | 375/376 |
| 2009/0322392 | A1 | * | 12/2009 | Miyamoto | 327/158 |
| 2010/0134171 | A1 | * | 6/2010 | Yoshida | 327/295 |
| 2010/0164573 | A1 | * | 7/2010 | Koo et al. | 327/158 |
| 2011/0291718 | A1 | * | 12/2011 | Lee | 327/158 |
| 2012/0112812 | A1 | * | 5/2012 | Chen et al. | 327/176 |
| 2013/0141149 | A1 | * | 6/2013 | Hsueh et al. | 327/175 |

FOREIGN PATENT DOCUMENTS

TW M241888 8/2004

* cited by examiner

*Primary Examiner* — Alexander H Taningco
*Assistant Examiner* — Dylan White
(74) *Attorney, Agent, or Firm* — Haverstock & Owens

(57) ABSTRACT

An all-digital clock generator includes a digitally-controlled clock generator and a processing unit. The digitally-controlled clock generator generates a clock signal in response to an enable signal and a digital signal. The processing unit has a frequency multiplier and a reference signal having a period, digitizes the period to generate a quantized signal, generates the digital signal according to the quantized signal and the frequency multiplier, and generates the enable signal according to the reference signal, the clock signal and the frequency multiplier.

20 Claims, 4 Drawing Sheets

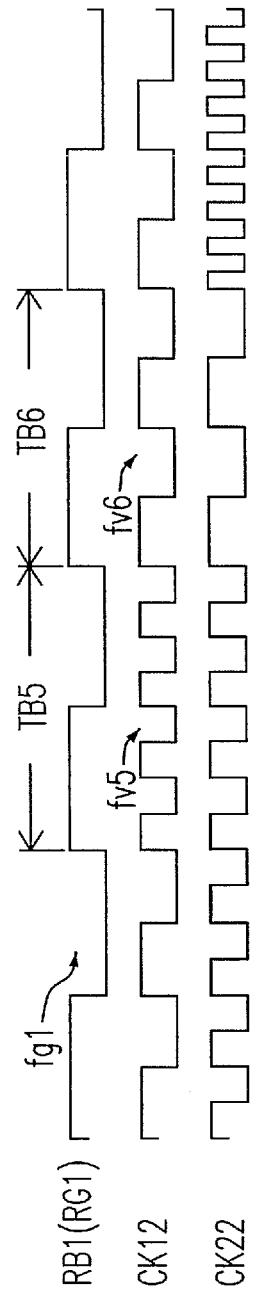
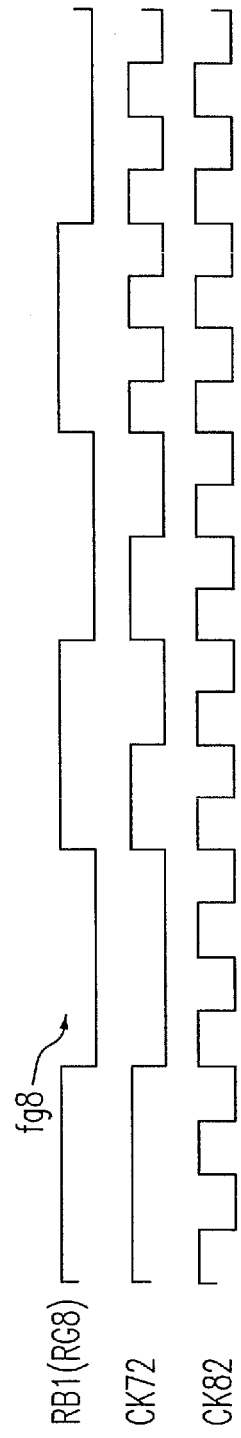
Fig. 4(a)
Fig. 4(b)

TIME-TO-DIGITAL CONVERTER AND DIGITAL-CONTROLLED CLOCK GENERATOR AND ALL-DIGITAL CLOCK GENERATOR

CROSS-REFERENCES TO RELATED APPLICATIONS

This application claims the benefit of Taiwan Patent Application No. 100128433, filed on Aug. 9, 2011, in the Taiwan Intellectual Property Office, the disclosures of which are incorporated herein in their entirety by reference.

FIELD OF THE INVENTION

The present invention relates to a clock generator, and more particularly to an all-digital clock generator having a time-to-digital converter and a digitally-controlled clock generator.

BACKGROUND OF THE INVENTION

In the prior art, a first phase-locked loop for generating a first clock signal includes a first phase frequency detector, a charge pump, a loop filter, a voltage controlled oscillator and a first frequency divider. The first phase frequency detector receives a first reference signal and a first feedback signal, and compares the first reference signal with the first feedback signal to generate a first comparison result signal. The first comparison result signal is converted into the first clock signal through the charge pump, the loop filter and the voltage controlled oscillator in turn. The first frequency divider has a first frequency divisor, and generates the first feedback signal according to the first frequency divisor and the first clock signal.

In the prior art, a second phase-locked loop for generating a second clock signal includes a second phase frequency detector, a control unit, a digitally-controlled oscillator and a second frequency divider. The second phase frequency detector receives a second reference signal and a second feedback signal, compares the second reference signal with the second feedback signal to generate a second comparison result signal. The control unit generates a digital adjustment signal according to the second comparison result signal. The digitally-controlled oscillator generates the second clock signal according to the digital adjustment signal. The second frequency divider has a second frequency divisor, and generates the second feedback signal according to the second frequency divisor and the second clock signal.

A technical scheme in the prior art disclosed in TW Patent No. M241,888 provides a counter-based all-digital clock multiplier.

Regarding the clock generating schemes in the prior art, it is necessary for most schemes thereof to utilize the digitally-controlled oscillator (DCO) or the voltage controlled oscillator (VCO) to make the frequency adjustment. In general, on some applications, it seems that the digitally-controlled oscillator or the voltage controlled oscillator is too complex on the hardware structure due to the frequency acquisition and the locking mechanism. Additionally, most of the clock generating schemes in the prior art employ the architecture having a single digitally-controlled oscillator or a single voltage controlled oscillator, and thus it seems that the schemes are not so flexible in the application of the multi-rate clock domain design.

SUMMARY OF THE INVENTION

It is an object of the present invention to provide an all-digital clock generator, which serves as a low-cost clock generator and the frequency of which can be quickly adjusted.

It is a first embodiment of the present invention to provide an all-digital clock generator. The all-digital clock generator includes a first digitally-controlled clock generator and a processing unit. The first digitally-controlled clock generator generates a first clock signal in response to a first enable signal and a first digital signal. The processing unit has a first frequency multiplier and a reference signal having a period, digitizes the period to generate a quantized signal, generates the first digital signal according to the quantized signal and the first frequency multiplier, and generates the first enable signal according to the reference signal, the first clock signal and the first frequency multiplier.

It is a second embodiment of the present invention to provide a time-to-digital converter. The time-to-digital converter includes an oscillation unit and a quantizing unit. The oscillation unit generates an oscillation signal in response to a first clock signal, wherein the first clock signal has a characteristic time interval. The quantizing unit generates a cycle-counting signal in response to the oscillation signal, samples the oscillation signal to generate a data signal in response to the first clock signal, and digitizes the characteristic time interval according to the cycle-counting signal and the data signal.

It is a third embodiment of the present invention to provide a digitally-controlled clock generator. The digitally-controlled clock generator includes a signal generating unit and a plurality of delay control units. The signal generating unit generates a first clock signal in response to a first signal. The plurality of delay control units, in response to the first clock signal, determines whether the first respective clock signal passes through the plurality of respective delay control units for forming the first signal.

BRIEF DESCRIPTION OF THE DRAWINGS

The foregoing and other features and advantages of the present invention will be more clearly understood through the following descriptions with reference to the drawings, wherein:

FIG. 4(a) and FIG. 4(b) are schematic diagrams respectively showing a first group of waveforms and a second group of waveforms of the all-digital clock generator in FIG. 3 according to embodiments of the present invention.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
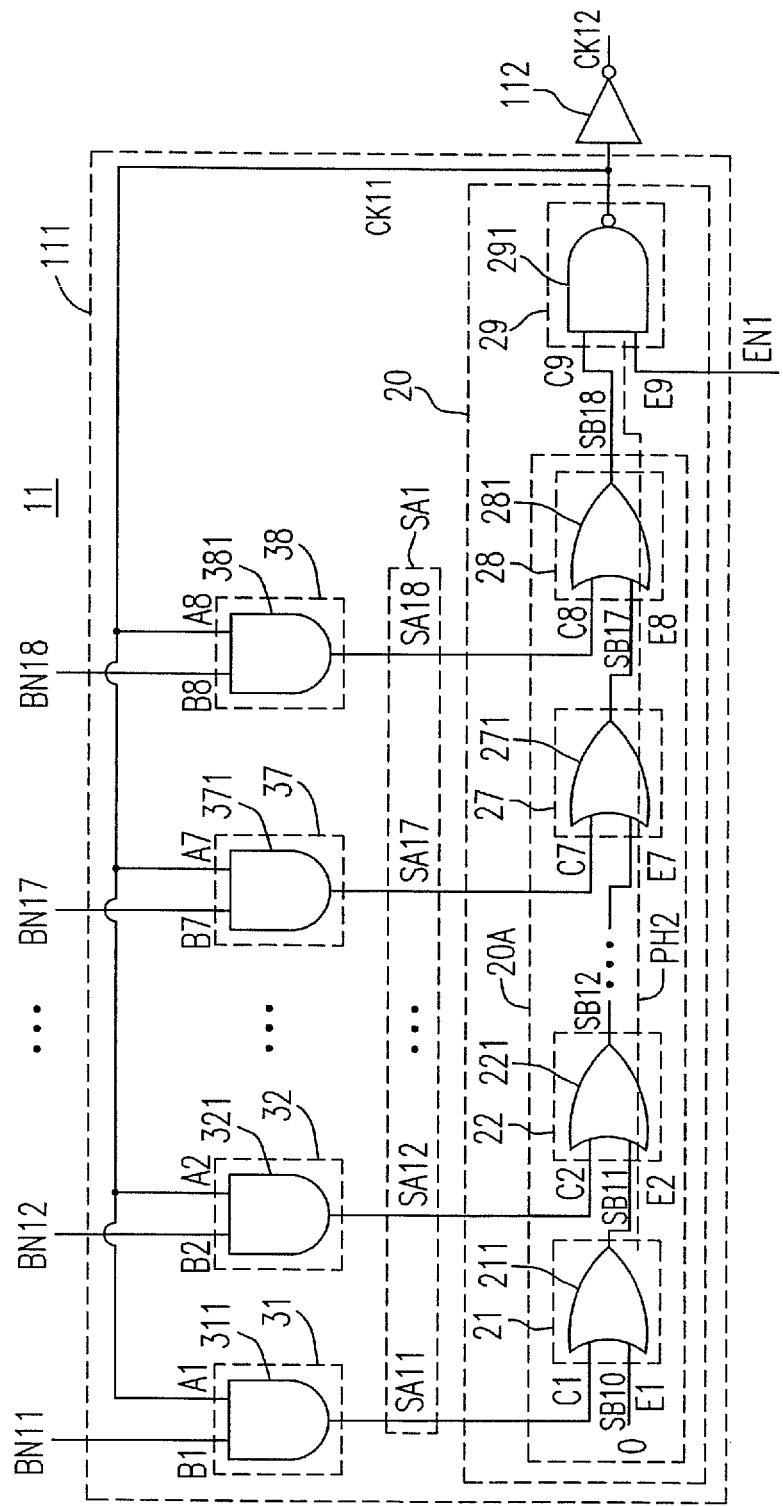
FIG. 1 is a schematic diagram showing a digitally-controlled clock generator according to one embodiment of the present invention.

Please refer to FIG. 1, which is a schematic diagram showing a digitally-controlled clock generator 11 according to one embodiment of the present invention. As shown, the digitally-controlled clock generator 11 includes a signal generating unit 20 and a plurality of delay control units 31, 32, ..., 37 and 38 coupled to the signal generating unit 20. The signal generating unit 20 generates a clock signal CK11 in response to a signal SA1. The plurality of delay control units 31, 32, ..., 37 and 38, in response to the clock signal CK11, determines whether the respective clock signal CK11 passes through the plurality of respective delay control units 31, 32, ..., 37 and 38 for forming the signal SA1.

In one embodiment, the signal generating unit 20 generates the clock signal CK11 in response to an enable signal EN1 and the signal SA1. The plurality of delay control units 31, 32, ..., 37 and 38, in response to the clock signal CK11 and a plurality of binary signals BN11, BN12, ..., BN17 and BN18, determine whether the respective clock signal CK11 passes through the plurality of respective delay control units 31, 32, ..., 37 and 38 for forming the signal SA1. For instance, the signal SA1 is a feedback signal and includes a plurality of sub-signals SA11, SA12, ..., SA17 and SA18. The plurality of sub-signals SA11, SA12, ..., SA17 and SA18 may be one of same sub-signal and different sub-signals. For instance, the digitally-controlled clock generator 11 is applied to an all-digital clock generator.

For instance, the digitally-controlled clock generator 11 includes a ring oscillator 111 and a NOT gate 112 coupled to the ring oscillator 111. For instance, the digitally-controlled clock generator 11 is a semi-synchronous clock generator. The ring oscillator 111 includes the signal generating unit 20 and the plurality of delay control units 31, 32, ..., 37 and 38. The NOT gate 112 generates a clock signal CK12 in response to the clock signal CK11. The enable signal EN1 determines a first time interval and a second time interval being selective and adjacent to the first time interval, wherein the clock signal CK11 is level-oscillatory in the first time interval, and is level-stable in the second time interval. For instance, the clock signal CK11 is level-oscillatory when the enable signal EN1 has an enable level; the clock signal CK11 is level-stable when the enable signal EN1 has a disable level.

Each of the plurality of delay control units 31, 32, ..., 37 and 38 receives the clock signal CK11, and the plurality of delay control units 31, 32, ..., 37 and 38 further receive the plurality of binary signals BN11, BN12, ..., BN17 and BN18, respectively, and respectively perform a plurality of logical AND operations according to the clock signal CK11 and the plurality of respective binary signals BN11, BN12, ..., BN17 and BN18 for respectively generating the plurality of sub-signals SA11, SA12, ..., SA17 and SA18, wherein the plurality of sub-signals SA11, SA12, ..., SA17 and SA18 includes a sub-signal SA11 and at least a sub-signal (SA18 and possible ones SA12, ... and SA17).

For instance, the plurality of delay control units 31, 32, ..., 37 and 38 respectively includes a plurality of AND gates 311, 321, ..., 371 and 381 for performing the plurality of respective logical AND operations. For instance, the plurality of delay control units 31, 32, ..., 37 and 38 are the plurality of AND gates 311, 321, ..., 371 and 381, respectively. The plurality of AND gates 311, 321, ..., 371 and 381 have a plurality of first input terminals A1, A2, ..., A7 and A8, respectively, further have a plurality of second input terminals B1, B2, ..., B7 and B8, respectively, and further have a plurality of output terminals, respectively. Each of the plurality of first input terminals A1, A2, ..., A7 and A8 receives the clock signal CK11. The plurality of second input terminals B1, B2, ..., B7 and B8 receive the plurality of binary signals BN11, BN12, ..., BN17 and BN18, respectively. The plurality of respective output terminals of the plurality of AND gates 311, 321, ..., 371 and 381 transmit the plurality of respective sub-signals SA11, SA12, ..., SA17 and SA18.

The signal generating unit 20 includes a delay module 20A and a delay unit 29 coupled to the delay module 20A. The delay module 20A generates a signal SB18 in response to the signal SA1. The delay unit 29 performs a logical NAND operation according to the enable signal EN1 and the signal SB18 for generating the clock signal CK11. For instance, the enable signal EN1 is a window signal. For instance, the delay module 20A includes a delay unit 21 and at least a delay unit (28 and possible ones 22, ... and 27) coupled to the delay unit 21. The delay unit 21 performs a logical OR operation in response to a signal SB10 and the sub-signal SA11 for generating a signal SB11. The at least a delay unit (28 and possible ones 22, ... and 27) performs at least a logical OR operation in response to the signal SB11 and the at least a sub-signal (SA18 and possible ones SA12, ... and SA17) for generating at least a signal (SB18 and possible ones SB12, ... and SB17), wherein the at least a signal (SB18 and possible ones SB12, ... and SB17) includes the signal SB18.

For instance, the signal SB10 is a low-level signal. The delay unit 29, the delay unit 21 and the at least a delay unit (28 and possible ones 22, ... and 27) respectively include an NAND gate 291, an OR gate 211 and at least an OR gate (281 and possible ones 221, ... and 271) for respectively performing the logical NAND operation, the logical OR operation and the at least a logical OR operation. For instance, the delay unit 29, the delay unit 21 and the at least a delay unit (28 and possible ones 22, ... and 27) are the NAND gate 291, the OR gate 211 and the at least an OR gate (281 and possible ones 221, ... and 271), respectively. For instance, the delay unit 21, the at least a delay unit (28 and possible ones 22, ... and 27) and the delay unit 29 have a path PH2 thereamong, and are connected in series through the path PH2.

The NAND gate 291 has a first input terminal C9, a second input terminal E9 and an output terminal. The first input terminal C9 receives the enable signal EN1, the second input terminal E9 receives the signal SB18, and the output terminal of the NAND gate 291 transmits the clock signal CK11. The plurality of OR gates 211, 221, ..., 271 and 281 have a plurality of first input terminals C1, C2, ..., C7 and C8, respectively, further have a plurality of second input terminals E1, E2, ..., E7 and E8, respectively, and further have a plurality of output terminals, respectively. The plurality of first input terminals C1, C2, ..., C7 and C8 receive the plurality of sub-signals SA11, SA12, ..., SA17 and SA18, respectively. The plurality of second input terminals E1, E2, ... and E8 receive the plurality of sub-signals SB10, SB11, ... and SB17, respectively. The plurality of respective output terminals of the plurality of OR gates 211, 221, ..., 271 and 281 transmit the plurality of respective signals SB11, SB12, ..., SB17 and SB18.

Figure 2:
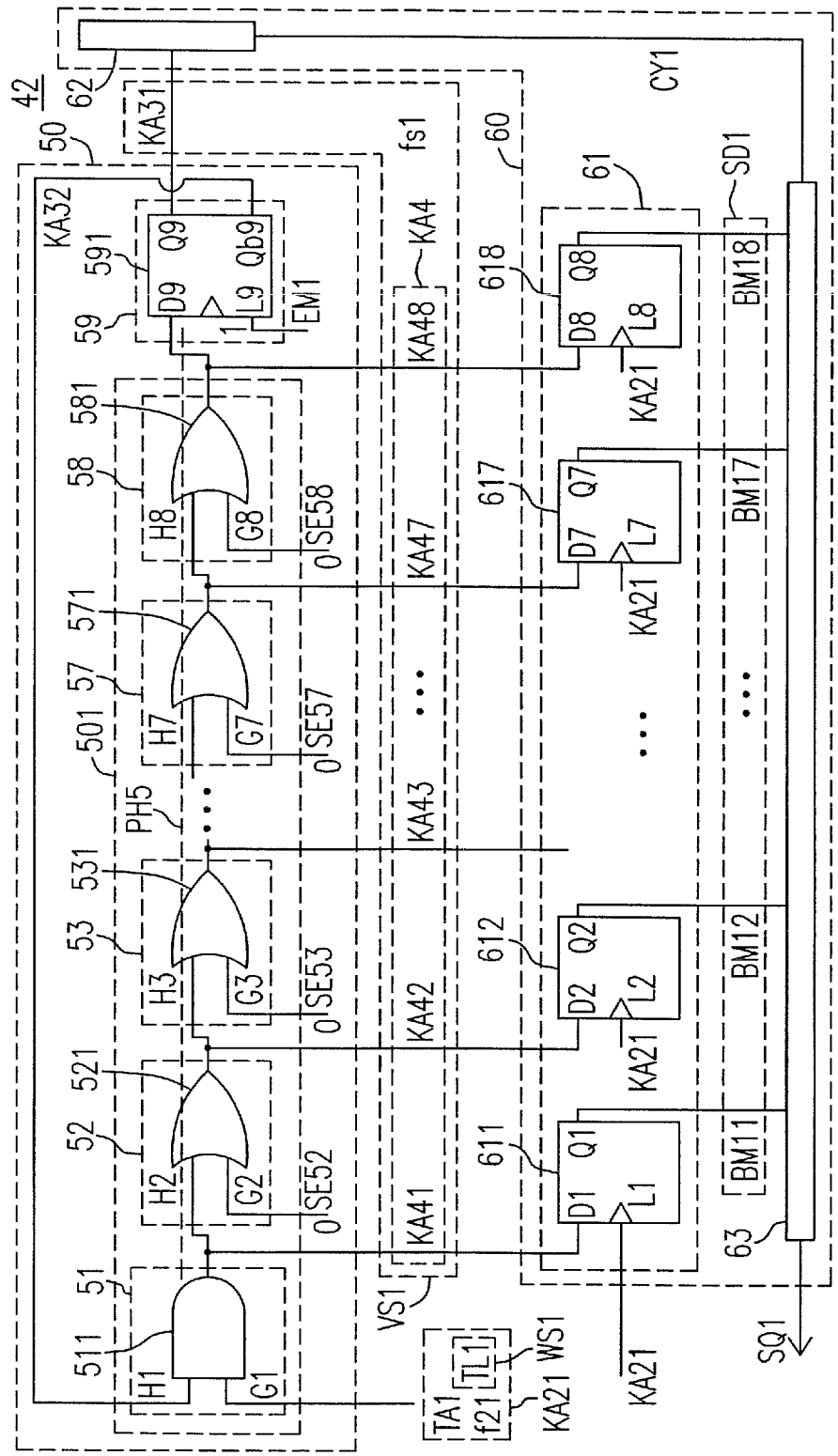
FIG. 2 is a schematic diagram showing a time-to-digital converter according to one embodiment of the present invention.

Please refer to FIG. 2, which is a schematic diagram showing a time-to-digital converter 42 according to one embodiment of the present invention. As shown, the time-to-digital converter 42 includes an oscillation unit 50 and a quantizing unit coupled to the oscillation unit 50. The oscillation unit 50 generates an oscillation signal VS1 in response to a clock signal KA21, wherein the clock signal KA21 has a characteristic time interval TA1. The quantizing unit 60 generates a cycle-counting signal CY1 in response to the oscillation signal VS1, sampling the oscillation signal VS1 to generate a data signal SD1 in response to the clock signal KA21, and digitizing the characteristic time interval TA1 according to the cycle-counting signal CY1 and the data signal SD1. For instance, the oscillation unit 50 includes a ring oscillator. For instance, the time-to-digital converter 42 is applied to an all-digital clock generator, and the ring oscillator includes a delay module 501 and a latch unit 59 coupled to the delay module 501.

For instance, the clock signal KA21 has a frequency f21, and the oscillation signal VS1 has a frequency fs1. For instance, the frequency fs1 may be higher than, equal to or lower than the frequency f21. The frequency fs1 of the oscillation signal VS1 may be determined according to the application demand and/or the circuit structure of the oscillation unit 50. The oscillation signal VS1 includes a clock signal KA31 and a clock signal KA4. The oscillation unit 50 includes the delay module 501 and the latch unit 59. The delay module 501 generates the clock signal KA4 in response to the clock signal KA21 and a feedback signal KA32, wherein the clock signal KA4 includes a plurality of clock sub-signals KA41, KA42, KA43, ..., KA47 and KA48, the plurality of clock sub-signals KA41, KA42, KA43, ..., KA47 and KA48 includes a clock sub-signal KA41 and at least a clock sub-signal (KA48 and possible ones KA42, KA43, ... and KA47), and the at least a clock sub-signal (KA48 and possible ones KA42, KA43, ... and KA47) includes a clock sub-signal KA48. For instance, the feedback signal KA32 is a clock signal.

The latch unit 59 generates the feedback signal KA32 and the clock signal KA31 in response to an enable signal EM1 and the clock sub-signal KA48. The delay module 501 includes a delay unit 51 and at least a delay unit (58 and possible ones 52, 53, ... and 57) coupled to the delay unit 51. The delay unit 51 performs a logical AND operation according to the feedback signal KA32 and the clock signal KA21 for generating the clock sub-signal KA41. The at least a second delay unit (58 and possible ones 52, 53, ... and 57) performs at least a logical OR operation in response to the clock sub-signal KA41 and at least a predetermined-level signal (SE58 and possible ones SE52, SE53, ... and SE57) for generating the at least a clock sub-signal (KA48 and possible ones KA42, KA43, ... and KA47). For instance, the at least a predetermined-level signal (SE58 and possible ones SE52, SE53, ... and SE57) is at least a low-level signal.

For instance, the latch unit 59 includes a D latch 591. The delay unit 51 and the at least a delay unit (58 and possible ones 52, 53, ... and 57) respectively include an AND gate 511 and at least an OR gate (581 and possible ones 521, 531, ... and 571) for respectively performing the logical AND operation and the at least a logical OR operation. For instance, the latch unit 59, the delay unit 51 and the at least a delay unit (58 and possible ones 52, 53, ... and 57) are the D latch 591, the AND gate 511 and the at least an OR gate (581 and possible ones 521, 531, ... and 571), respectively. The delay unit 51, the at least a delay unit (58 and possible ones 52, 53, ... and 57) and the latch unit 59 have a path PH5 thereamong, and are connected in series through the path PH5.

For instance, the clock signal KA21 further has two neighboring edges, and the characteristic time interval TA1 is a period between the two neighboring edges. For instance, the two neighboring edges are a rising edge and a falling edge, respectively. For instance, the clock signal KA31 and the plurality of clock sub-signals KA41, KA42, KA43, ..., KA47 and KA48 have the same frequency, and any two selected from a group consisting of the clock signal KA31 and the plurality of clock sub-signals KA41, KA42, KA43, ..., KA47 and KA48 have a phase difference therebetween. The D latch 591 has an enable control terminal L9, a data input terminal D9, a data output terminal Q9 and an inverting data output terminal Qb9. The enable control terminal L9 receives the enable signal EM1, the data input terminal D9 receives the clock sub-signal KA48, the data output terminal Q9 transmits the clock signal KA31, and the inverting data output terminal Qb9 transmits the feedback signal KA32. For instance, the enable signal EM1 has an enable level.

The AND gate 511 has a first input terminal G1, a second input terminal H1 and an output terminal. The first input terminal G1 receives the clock signal KA21, the second input terminal H1 receives the feedback signal KA32, and the output terminal of the AND gate 511 transmits the clock sub-signal KA41. The plurality of OR gates 521, 531, ... and 581 have a plurality of first input terminals G2, G3, ... and G8, respectively, further have a plurality of second input terminals H2, H3, ... and H8, respectively, and further have a plurality of output terminals, respectively. The plurality of first input terminals G2, G3, ... and G8 receives the plurality of predetermined-level signals SE52, SE53, ... and SE58, respectively. The plurality of second input terminals H2, H3, ... and H8 receives the plurality of clock sub-signals KA41, KA42, ... and KA47, respectively. The plurality of respective output terminals of the plurality of OR gates 521, 531, ... and 581 transmit the plurality of respective clock sub-signals KA42, KA43, ..., KA47 and KA48. For instance, each of the plurality of predetermined-level signals SE52, SE53, ... and SE58 is a low-level signal.

The quantizing unit 60 includes a flip-flop unit 61, a cascaded counter 62 and an encoder 63, and the encoder 63 is coupled to the flip-flop unit 61 and the cascaded counter 62. The flip-flop unit 61 samples the clock signal KA4 to generate the data signal SD1 in response to the clock signal KA21, wherein the data signal SD1 includes a plurality of binary signals BM11, BM12, ..., BM17 and BM18. The cascaded counter 62 generates the cycle-counting signal CY1 in response to the clock signal KA31. The encoder 63 digitizes the characteristic time interval TA1 to generate a quantized signal SQ1 according to the cycle-counting signal CY1 and the data signal SD1. For instance, the clock signal KA21 further has a pulse WS1, wherein the pulse WS1 has the two neighboring edges and a pulse duration TL1, and the characteristic time interval TA1 is the pulse duration TL1.

The flip-flop unit 61 includes a plurality of D flip-flops 611, 612, ..., 617 and 618, wherein the plurality of D flip-flops 611, 612, ..., 617 and 618 are simultaneously triggered by the clock signal KA21 to respectively sample the plurality of clock sub-signals KA41, KA42, KA43, ..., KA47 and KA48 for generating the plurality of respective binary signals BM11, BM12, ..., BM17 and BM18. The plurality of D flip-flops 611, 612, ..., 617 and 618 have a plurality of clock input terminals L1, L2, ..., L7 and L8, respectively, further have a plurality of data input terminals D1, D2, ..., D7 and D8, respectively, and further have a plurality of data output terminals Q1, Q2, ..., Q7 and Q8, respectively. Each of the plurality of clock input terminals L1, L2, ..., L7 and L8 receives the clock signal KA21. The plurality of data input terminals D1, D2, ..., D7 and D8 receive the plurality of clock sub-signals KA41, KA42, ..., KA47 and KA48, respectively. The plurality of data output terminals Q1, Q2, ..., Q7 and Q8 transmit the plurality of binary signals BM11, BM12, ..., BM17 and BM18, respectively.

For instance, the clock signal KA21 determines a first time interval and a second time interval, wherein the oscillation signal VS1 is level-oscillatory in the first time interval, and is level-stable in the second time interval. For instance, the pulse WS1 determines the first time interval. For instance, the falling edge of the pulse WS1 simultaneously triggers the plurality of D flip-flops 611, 612, ..., 617 and 618 to cause the plurality of respective clock sub-signals KA41, KA42, ..., KA47 and KA48 to be sampled.

As shown in FIG. 1, the plurality of OR gates 211, 221, ..., 271 and 281 of the digitally-controlled clock generator 11 are connected in series through the path PH2. As shown in FIG. 2, the plurality of OR gates 521, 531, ... and 571 of the time-to-digital converter 42 are connected in series through the path PH5. Because the plurality of OR gates 211, 221, ..., 271 and 281 and the plurality of OR gates 521, 531, ... and 571 use the same structure, the digital data generated by the time-to-digital converter 42 and the control signals of the digitally-controlled clock generator 11 may be mutually corresponding through a simple logic so as to reduce the operation delay and the hardware complexity.

Figure 3:
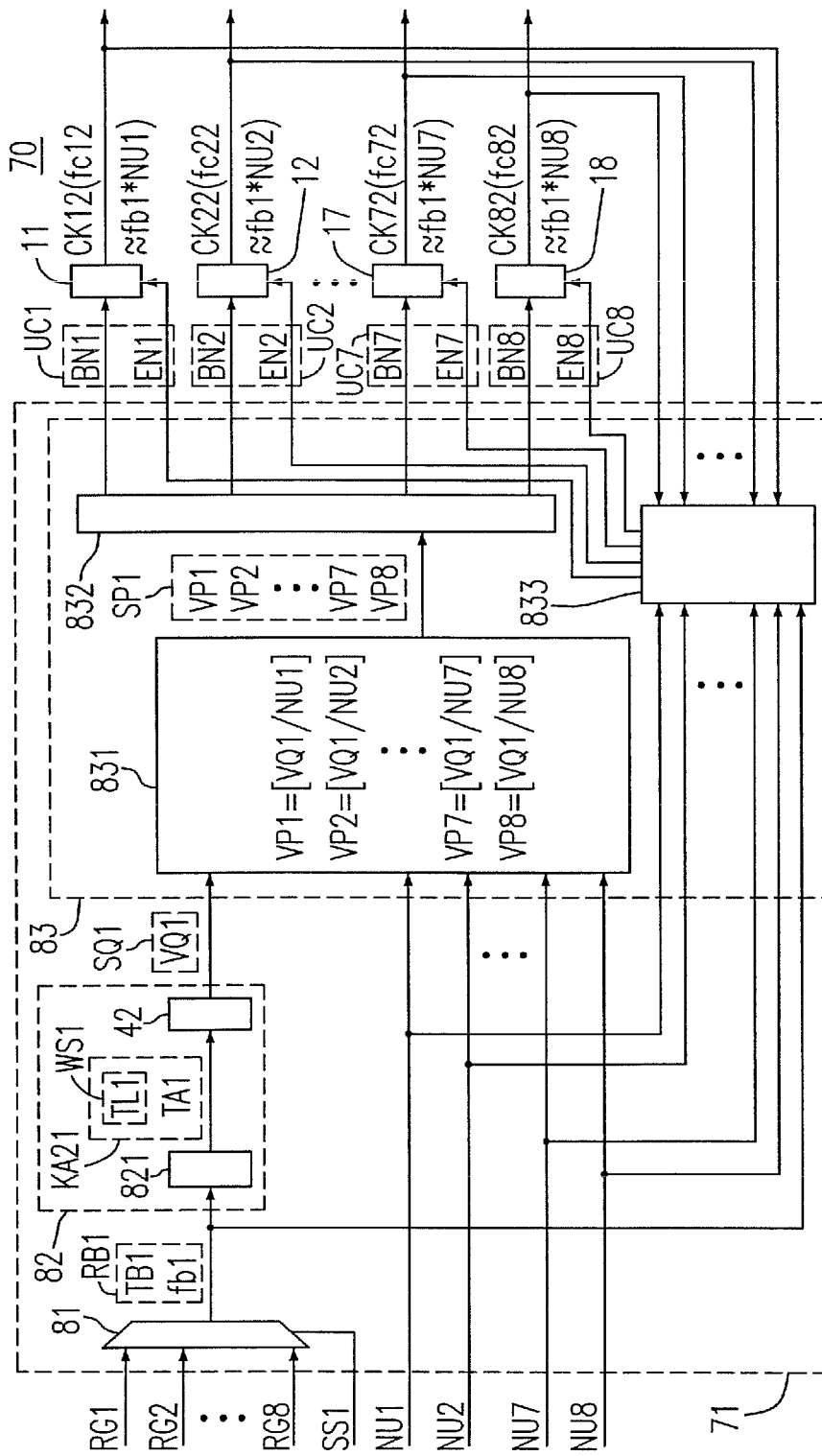
FIG. 3 is a schematic diagram showing an all-digital clock generator according to one embodiment of the present invention.

Please refer to FIG. 3, which is a schematic diagram showing an all-digital clock generator 70 according to one embodiment of the present invention. As shown, the all-digital clock generator 70 includes a digitally-controlled clock generator 11 and a processing unit 71 coupled to the digitally-controlled clock generator 11. The digitally-controlled clock generator 11 generates a clock signal CK12 in response to an enable signal EN1 and a digital signal BN1. The processing unit 71 has a frequency multiplier NU1 and a reference signal RB1, wherein the reference signal RB1 has a period TB1. The processing unit 71 digitizes the period TB1 to generate a quantized signal SQ1, generates the digital signal BN1 according to the quantized signal SQ1 and the frequency multiplier NU1, and generates the enable signal EN1 according to the reference signal RB1, the clock signal CK12 and the frequency multiplier NU1. For instance, the digital signal BN1 includes a plurality of binary signals BN11, BN12, ..., BN17 and BN18.

For instance, the all-digital clock generator 70 has at least an enable signal (EN8 and possible ones EN2, ... and EN7) and at least a digital signal (BN8 and possible ones BN2, ... and BN7), and further includes at least a digitally-controlled clock generator (18 and possible ones 12, ... and 17). The at least a digitally-controlled clock generator (18 and possible ones 12, ... and 17) generates at least a clock signal (CK82 and possible ones CK22, ... and CK72) in response to the at least an enable signal (EN8 and possible ones EN2, ... and EN7) and the at least a digital signal (BN8 and possible ones BN2, ... and BN7). For instance, the reference signal RB1 has a frequency fb1 being a reciprocal of the period TB1. The processing unit 71 has the reference signal RB1 and a plurality of frequency multipliers NU1, NU2, ..., NU7 and NU8, and generates a plurality of control signals UC1, UC2, ..., UC7 and UC8 according to the reference signal RB1 and the plurality of frequency multipliers NU1, NU2, ..., NU7 and NU8, wherein the plurality of frequency multipliers NU1, NU2, ..., NU7 and NU8 are the same or different.

The plurality of digitally-controlled clock generators 11, 12, ..., 17 and 18 generate a plurality of clock signals CK12, CK22, ..., CK72 and CK82 in response to the plurality of respective control signals UC1, UC2, ..., UC7 and UC8. The plurality of control signals UC1, UC2, ..., UC7 and UC8 respectively correspond to the plurality of frequency multipliers NU1, NU2, ..., NU7 and NU8, respectively include the plurality of enable signals EN1, EN2, ..., EN7 and EN8, and further respectively include the plurality of digital signals BN1, BN2, ..., BN7 and BN8. The plurality of clock signals CK12, CK22, ..., CK72 and CK82 respectively have a plurality of frequency fc12, fc22, ..., fc72 and fc82, and the plurality of frequency fc12, fc22, ..., fc72 and fc82 respectively have a plurality of frequency relations (fc12≈fb1*NU1), (fc22≈fb1*NU2), ..., (fc72≈fb1*NU7) and (fc82≈fb1*NU8), wherein the symbol ≈ indicate an equaling operation with an error range.

For instance, the processing unit 71 includes a multiplexer 81, a time-to-digital converting module 82 and a control unit 83, wherein the time-to-digital converting module 82 is coupled to the multiplexer 81, and the control unit 83 is coupled to the time-to-digital converting module 82. The multiplexer 82 receives a plurality of input signals RG1, RG2, ... and RG8 and a selection signal SS1, and selects one of the plurality of input signals RG1, RG2, ... and RG8 to form the reference signal RB1 according to the selection signal SS1. For instance, the plurality of input signals RG1, RG2, ... and RG8 are a plurality of clock signals, and any two of the plurality of input signals RG1, RG2, ... and RG8 have frequencies being different therebetween. The time-to-digital converting module 82 digitizes the period TB1 to generate the quantized signal SQ1 in response to the reference signal RB1.

The control unit 83 has the frequency multiplier NU1, and generates the enable signal EN1 and the digital signal BN1 according to the reference signal RB1, the frequency multiplier NU1, the quantized signal SQ1 and the clock signal CK12, wherein the control unit 83 further has at least a frequency multiplier (NU8 and possible ones NU2, ... and NU7), and generates the at least an enable signal (EN8 and possible ones EN2, ... and EN7) and the at least a digital signal (BN8 and possible ones BN2, ... and BN7) according to the reference signal RB1, the at least a frequency multiplier (NU8 and possible ones NU2, ... and NU7), the quantized signal SQ1 and the at least a clock signal (CK82 and possible ones CK22, ... and CK72).

For instance, the control unit 83 generates the plurality of control signals UC1, UC2, ..., UC7 and UC8 according to the reference signal RB1, the plurality of frequency multipliers NU1, NU2, ..., NU7 and NU8, the quantized signal SQ1 and the plurality of clock signals CK12, CK22, ..., CK72 and CK82, wherein the plurality of control signals UC1, UC2, ..., UC7 and UC8 include the enable signal EN1, the at least an enable signal (EN8 and possible ones EN2, ... and EN7), the digital signal BN1 and the at least a digital signal (BN8 and possible ones BN2, ... and BN7).

The time-to-digital converting module 82 includes a clock regenerator 821 and a time-to-digital converter 42 coupled to the clock regenerator 821. The clock regenerator 821 generates a clock signal KA21 in response to the reference signal RB1, wherein the reference signal RB1 has a first characteristic time point and a second characteristic time point to define the period TB1. For instance, the first and the second characteristic time points are characterized by two neighboring rising edges of the reference signal RB1, respectively. The clock signal KA21 has a characteristic time interval TA1 and a pulse WS1. The pulse WS1 has a pulse duration TL1, and the pulse duration TL1 starts at the first characteristic time point and stops at the second characteristic time point. For instance, the characteristic time interval TA1 is the pulse duration TL1 and is applied to determining the period TB1. For instance, the period of the clock signal KA21 is 2 times as large as the period TB1.

The time-to-digital converter 42 digitizes the pulse duration TL1 to generate the quantized signal SQ1 in response to the clock signal KA21, wherein the quantized signal SQ1 includes a quantized value VQ1. The control unit 83 includes a divider 831, a decoder 832 and a counter 833, wherein the decoder 832 is coupled to the divider 831, and the counter 833 is coupled to the decoder 832 through at least one of the plurality of digitally-controlled clock generators 11, 12, ..., 17 and 18.

The divider 831 generates a quotient signal SP1. The quotient signal SP1 includes a quotient VP1 and at least a quotient (VP8 and possible ones VP2, ... and VP7), wherein the quotient VP1 and the at least a quotient (VP8 and possible ones VP2, ... and VP7) correspond to the frequency multiplier NU1 and the at least a frequency multiplier (NU8 and possible ones NU2, ... and NU7), respectively. The divider 831 performs a division operation according to the quantized value VQ1 and the frequency multiplier NU1 for generating the quotient VP1, and performs at least a division operation according to the quantized value VQ1 and the at least a frequency multiplier (NU8 and possible ones NU2, . . . and NU7) for generating the at least a quotient (VP8 and possible ones VP2, . . . and VP7). The frequency multiplier NU1 and the at least a frequency multiplier (NU8 and possible ones NU2, . . . and NU7) are a first divisor and at least a second divisor, respectively, and the quantized value VQ1 serves as a dividend for the first divisor and the at least a second divisor. For instance, the plurality of quotients VP1, VP2, . . . , VP7 and VP8 are a plurality of integers, and are the same or different.

The decoder 832 generates the digital signal BN1 and the at least a digital signal (BN8 and possible ones BN2, . . . and BN7) according to the quotient signal SP1, wherein the quotient VP1 and the at least a quotient (VP8 and possible ones VP2, . . . and VP7) correspond to the digital signal BN1 and the at least a digital signal (BN8 and possible ones BN2, . . . and BN7), respectively. The counter 833 generates the enable signal EN1 according to the reference signal RB1, the frequency multiplier NU1 and the clock signal CK12, and generates the at least an enable signal (EN8 and possible ones EN2, . . . and EN7) according to the reference signal RB1, the at least a frequency multiplier (NU8 and possible ones NU2, . . . and NU7) and the at least a clock signal (CK82 and possible ones CK22, . . . and CK72). For instance, the divider 831 includes a plurality of shift registers. For instance, the frequency multiplier NU1 and the at least a frequency multiplier (NU8 and possible ones NU2, . . . and NU7) are a first exponentiation $2^{N1}$ and at least a second exponentiation $2^{N2}$, respectively, wherein N1 and N2 are a first positive integer and a second positive integer, respectively.

The reference signal RB1 has a first reference edge and a second reference edge lagged behind the first reference edge by the period TB1. For instance, the first and the second reference edges are two neighboring rising edges of the reference signal RB1, respectively. The counter 833, in response to the first reference edge, causes the enable signal EN1 to have an enable level so that the digitally-controlled clock generator 11 makes a first series of level oscillations, and causes the counter 833 to begin to count the clock signal CK12. The counter 833 counts the clock signal CK12 from the first reference edge to determine a period number, and when the period number and the frequency multiplier NU1 has a specific relation therebetween, the digitally-controlled clock generator 11 stops the first series of level oscillations. For instance, the counter 833 causes the enable signal EN1 to have a disable level when the period number reaches the frequency multiplier NU1 or the specific relation is satisfied, wherein the disable level causes the digitally-controlled clock generator 11 to stop the first series of level oscillations.

The counter 833 causes the digitally-controlled clock generator 11 to renew a second series of level oscillations when the second reference edge appears in the reference signal RB1. The counter 833 restarts to count the clock signal CK12 in response to the second reference edge. The operation between the counter 833 and any of the plurality of digitally-controlled clock generators 12, . . . , 17 and 18 is similar to that between the counter 833 and the digitally-controlled clock generator 11.

As shown in FIG. 3, the clock regenerator 821 generates the pulse WS1. The pulse duration TL1 of the pulse WS1 is derived from or equal to the period TB1 of the reference signal RB1 for avoiding the problem of the unbalanced duty cycle in the reference signal RB1. The time-to-digital converter 42 quantizes the period TB1; under this condition, the quantized value VQ1 measured by the time-to-digital converter 42 will not be affected by the duty ratio of the reference signal RB1. The divider 831 receives the quantized value VQ1 generated by the time-to-digital converter 42, and generates the quotients respectively near to or equal to the values VQ1/NU1, VQ1/NU2, . . . , VQ1/NU7 and VQ1/NU8. For instance, the divider 831 is implemented by a plurality of shift registers. For instance, the plurality of frequency multipliers NU1, NU2, . . . , NU7 and NU8 are a plurality of positive-integer powers of 2.

The decoder 832 converts the plurality of respective quotients VP1, VP2, . . . , VP7 and VP8 into the plurality of digital signals BN1, BN2, . . . , BN7 and BN8. The plurality of digital signals BN1, BN2, . . . , BN7 and BN8 respectively control the plurality of digitally-controlled clock generators 11, 12, . . . , 17 and 18 to generate the plurality of clock signals CK12, CK22, . . . , CK72 and CK82. When a rising edge of the reference signal RB1 triggers the plurality of clock signals CK12, CK22, . . . , CK72 and CK82 to have pulses, the counter 833 begins to count. For instance, when the counted period number of the clock signal CK12 of the digitally-controlled clock generators 11 reaches the frequency multiplier NU1, the digitally-controlled clock generators 11 stops generating pulses of the clock signal CK12. When the next rising edge triggers the digitally-controlled clock generators 11, the digitally-controlled clock generators 11 can begin to generate pulses of the clock signal CK12 anew and the counter 833 restarts to count. Employing m digitally-controlled clock generators, clock signals respectively having m different frequencies may be generated for use in different domains of a system, wherein m is a positive integer.

As shown in FIG. 3, high-speed multiple clock signals can be generated by employing the architecture of the all-digital clock generator 70 with the lower hardware cost, and the all-digital clock generator 70 is a fast-adjustable multiple-in-multiple-out semi-synchronous clock generator. The all-digital clock generator 70 is implemented by an all-digital circuit. When the user gives the reference signal RB1, the reference signal RB1 can cause the all-digital clock generator 70 to generate a clock signal by changing a specific frequency multiplier so that the frequency of the clock signal is approximate to a specific frequency, wherein the specific frequency is established by multiplying the changed frequency multiplier by the frequency fb1 of the reference signal RB1.

As shown in FIG. 3, the all-digital clock generator 70 can rapidly adjust the oscillation frequency of the digitally-controlled clock generator 11, and utilizes the processing unit 71 to generate the plurality of control signals UC1, UC2, . . . , UC7 and UC8, which respectively control the plurality of digitally-controlled clock generators 11, 12, . . . , 17 and 18, for outputting arbitrarily different combinations of clock signals. The all-digital clock generator 70 supports the inputs of the plurality of input signals RG1, RG2, . . . and RG8, may simultaneously control plural groups of outputs having arbitrary multiples of the frequencies of the plurality of input signals RG1, RG2, . . . and RG8, and may be flexibly applied to the multi-rate clock domain design.

Please refer to FIG. 4(a) and FIG. 4(b), which are schematic diagrams respectively showing a first group of waveforms and a second group of waveforms of the all-digital clock generator 70 in FIG. 3 according to embodiments of the present invention. In FIG. 4(a), the first group of waveforms includes waveforms of the reference signal RB1 and the two clock signals CK12 and CK22. In FIG. 4(a), the reference signal RB1 is the input signal RG1; that is, the multiplexer 82 selects the input signal RG1 of the plurality of input signals RG1, RG2, . . . and RG8 to form the reference signal RB1 according the selection signal SS1, wherein the input signal RG1 has a frequency fg1.

In FIG. 4(b), the second group of waveforms includes waveforms of the reference signal RB1 and the two clock signals CK72 and CK82. In FIG. 4(b), the reference signal RB1 is the input signal RG8; that is, the multiplexer 82 selects the input signal RG8 of the plurality of input signals RG1, RG2, . . . and RG8 to form the reference signal RB1 according the selection signal SS1, wherein the input signal RG8 has a frequency fg8. As shown in FIG. 4(a) and FIG. 4(b), the frequency fg1 is higher than the frequency fg8. As shown in FIG. 4(a), the reference signal RB1 has two neighboring periods TB5 and TB6. The clock signal CK12 has a frequency fv5 in the period TB5, the clock signal CK12 has a frequency fv6 in the period TB6, and the frequencies fv5 and fv6 may be different by changing the frequency multiplier NU1. Additionally, the all-digital clock generator 70 may be configured to set the respective multipliers anew, which are the ratios of the respective output frequencies of the plurality of digitally-controlled clock generators 11, 12, . . . , 17 and 18 to the reference frequency (such as the frequency fb1), for each period of the reference signal RB1.

Embodiments

1. An all-digital clock generator includes a first digitally-controlled clock generator and a processing unit. The first digitally-controlled clock generator generates a first clock signal in response to a first enable signal and a first digital signal. The processing unit has a first frequency multiplier and a reference signal having a period, digitizes the period to generate a quantized signal, generates the first digital signal according to the quantized signal and the first frequency multiplier, and generates the first enable signal according to the reference signal, the first clock signal and the first frequency multiplier.

2. The all-digital clock generator of embodiment 1 has at least a second enable signal and at least a second digital signal, and further includes at least a second digitally-controlled clock generator, wherein the at least a second digitally-controlled clock generator generates at least a second clock signal in response to the second enable signal and the second digital signal.

3. The all-digital clock generator of embodiments 1-2 wherein the processing unit includes a multiplexer, a time-to-digital converting module and a control unit. The multiplexer receives a plurality of input signals and a selection signal, and selects one of the plurality of input signals to form the reference signal according to the selection signal. The time-to-digital converting module digitizes the period to generate the quantized signal in response to the reference signal. The control unit has the first frequency multiplier, and generates the first enable signal and the first digital signal according to the reference signal, the first frequency multiplier, the quantized signal and the first clock signal, wherein the control unit further has at least a second frequency multiplier, and generates the at least a second enable signal and the at least a second digital signal according to the reference signal, the second frequency multiplier, the quantized signal and the second clock signal.

4. The all-digital clock generator of embodiments 1-3 wherein the time-to-digital converting module includes a clock regenerator and a time-to-digital converter. The clock regenerator generates a third clock signal in response to the reference signal, wherein the reference signal has a first characteristic time point and a second characteristic time point to define the period, the third clock signal has a pulse having a pulse duration, and the pulse duration starts at the first characteristic time point and stops at the second characteristic time point. The time-to-digital converter digitizes the pulse duration to generate the quantized signal in response to the third clock signal, wherein the quantized signal includes a quantized value.

5. The all-digital clock generator of embodiments 1-4 wherein the time-to-digital converter includes an oscillation unit and a quantizing unit. The oscillation unit generates an oscillation signal in response to the third clock signal. The quantizing unit generates a cycle-counting signal in response to the oscillation signal, samples the oscillation signal to generate a data signal in response to the third clock signal, and digitizes the pulse duration according to the cycle-counting signal and the data signal.

6. The all-digital clock generator of embodiments 1-5 wherein the control unit includes a divider, a decoder and a counter. The divider generates a quotient signal, wherein the quotient signal includes a first quotient and at least a second quotient respectively corresponding to the first frequency multiplier and the at least a second frequency multiplier; the divider performs a first division operation according to the quantized value and the first frequency multiplier for generating the first quotient, and performs at least a second division operation according to the quantized value and the second frequency multiplier for generating the second quotient; the first frequency multiplier and the second frequency multiplier are a first divisor and a second divisor, respectively; and the quantized value serves as a dividend for the first divisor and the second divisor. The decoder generates the first digital signal and the at least a second digital signal according to the quotient signal, wherein the first quotient and the second quotient correspond to the first digital signal and the second digital signal, respectively. The counter generates the first enable signal according to the reference signal, the first frequency multiplier and the first clock signal, and generates the at least a second enable signal according to the reference signal, the second frequency multiplier and the second clock signal.

7. The all-digital clock generator of embodiments 1-6 wherein the divider includes a plurality of shift registers; and the first frequency multiplier and the second frequency multiplier are a first exponentiation $2^{N1}$ and a second exponentiation $2^{N2}$, respectively, wherein N1 and N2 are a first positive integer and a second positive integer, respectively.

8. The all-digital clock generator of embodiments 1-7 wherein the reference signal has a first reference edge and a second reference edge lagged behind the first reference edge by the period; the counter, in response to the first reference edge, causes the first enable signal to have an enable level so that the first digitally-controlled clock generator makes a first series of level oscillations, and causes the counter to begin to count the first clock signal; the counter counts the first clock signal from the first reference edge to determine a period number; the counter causes the first enable signal to have a disable level when the period number reaches the first frequency multiplier, wherein the disable level causes the first digitally-controlled clock generator to stop the first series of level oscillations; the counter causes the first digitally-controlled clock generator to renew a second series of level oscillations when the second reference edge appears in the reference signal; and the counter restarts to count the first clock signal in response to the second reference edge.

9. The all-digital clock generator of embodiments 1-8 wherein the first digital signal includes a plurality of binary signals, and the first digitally-controlled clock generator includes a signal generating unit, a plurality of delay control units and a NOT gate. The signal generating unit generates a second clock signal in response to the first enable signal and a first signal. The plurality of delay control units, in response to the second clock signal and the plurality of binary signals, determines whether the respective second clock signal passes through the plurality of respective delay control units for forming the first signal. The NOT gate generates the first clock signal in response to the second clock signal.

10. A time-to-digital converter includes an oscillation unit and a quantizing unit. The oscillation unit generates an oscillation signal in response to a first clock signal, wherein the first clock signal has a characteristic time interval. The quantizing unit generates a cycle-counting signal in response to the oscillation signal, samples the oscillation signal to generate a data signal in response to the first clock signal, and digitizes the characteristic time interval according to the cycle-counting signal and the data signal.

11. The time-to-digital converter of embodiment 10 is applied to an all-digital clock generator, wherein the oscillation signal includes a second clock signal and a third clock signal, and the oscillation unit includes a delay module and a latch unit. The delay module generates the third clock signal in response to the first clock signal and a feedback signal, wherein the third clock signal includes a plurality of clock sub-signals, and the plurality of clock sub-signals include a first clock sub-signal and at least a second clock sub-signal. The latch unit generates the feedback signal and the second clock signal in response to an enable signal and the second clock sub-signal.

12. The time-to-digital converter of embodiment 10-11 wherein the delay module includes a first delay unit and at least a second delay unit. The first delay unit performs a logical AND operation according to the feedback signal and the first clock signal for generating the first clock sub-signal. The at least a second delay unit performs at least a logical OR operation in response to the first clock sub-signal and a predetermined-level signal for generating the second clock sub-signal.

13. The time-to-digital converter of embodiment 10-12 wherein the predetermined-level signal is a low-level signal; the latch unit includes a D latch having an enable control terminal, a data input terminal, a data output terminal and an inverting data output terminal, wherein the enable control terminal receives the enable signal, the data input terminal receives the second clock sub-signal, the data output terminal transmits the second clock signal, and the inverting data output terminal transmits the feedback signal; the first clock signal further has two neighboring edges, and the characteristic time interval is a period between the two neighboring edges; any two selected from a group consisting of the second clock signal and the plurality of clock sub-signals have a phase difference therebetween; and the first delay unit, the second delay unit and the latch unit have a path thereamong, and are connected in series through the path.

14. The time-to-digital converter of embodiment 10-13 wherein the data signal includes a plurality of binary signals; the first clock signal further has a pulse, wherein the pulse has the two neighboring edges and a pulse duration, and the characteristic time interval is the pulse duration; the cycle-counting signal is generated according to the second clock signal; the plurality of clock sub-signals are simultaneously sampled according to the first clock signal for generating the plurality of respective binary signals; and the characteristic time interval is digitized to generate a quantized signal according to the cycle-counting signal and the data signal.

15. A digitally-controlled clock generator includes a signal generating unit and a plurality of delay control units. The signal generating unit generates a first clock signal in response to a first signal. The plurality of delay control units, in response to the first clock signal, determines whether the first respective clock signal passes through the plurality of respective delay control units for forming the first signal.

16. The digitally-controlled clock generator of embodiment 15 is applied to an all-digital clock generator, wherein the first clock signal is generated further in response to an enable signal; whether the first respective clock signal passes through the plurality of respective delay control units is determined further in response to a plurality of binary signals; the first signal includes a plurality of sub-signals; the plurality of sub-signals are one of same sub-signal and different sub-signals; the enable signal determines a first time interval and a second time interval being selective and adjacent to the first time interval, wherein the first clock signal is level-oscillatory in the first time interval and is level-stable in the second time interval; and each of the plurality of delay control units receives the first clock signal, and the plurality of delay control units further receive the plurality of binary signals, respectively, and respectively perform a plurality of logical AND operations according to the first clock signal and the plurality of respective binary signals for respectively generating the plurality of sub-signals, wherein the plurality of sub-signals include a first sub-signal and at least a second sub-signal.

17. The digitally-controlled clock generator of embodiment 15-16 wherein the signal generating unit includes a delay module and a first delay unit. The delay module generates a second signal in response to the first signal. The first delay unit performs a logical NAND operation according to the enable signal and the second signal for generating the first clock signal.

18. The digitally-controlled clock generator of embodiment 15-17 wherein the delay module includes a second delay unit and at least a third delay unit. The second delay unit performs a first logical OR operation in response to a third signal and the first sub-signal for generating a fourth signal. The at least a third delay unit has a fifth signal associated with the fourth signal, and performs a second logical OR operation in response to the fifth signal and the second sub-signal for generating the second signal.

19. The digitally-controlled clock generator of embodiment 15-18 wherein the third signal is a low-level signal; and the second delay unit, the third delay unit and the first delay unit have a path thereamong, and are connected in series through the path.

20. The digitally-controlled clock generator of embodiment 15-19 further includes a NOT gate, wherein the NOT gate generates a second clock signal in response to the first clock signal.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An all-digital clock generator, comprising:
  a first digitally-controlled clock generator generating a first clock signal in response to a first enable signal and a first digital signal; and a processing unit having a first frequency multiplier and a reference signal having a period, digitizing the period to generate a quantized signal, generating the first digital signal according to the quantized signal and the first frequency multiplier, and generating the first enable signal according to the reference signal, the first clock signal and the first frequency multiplier.

2. An all-digital clock generator according to claim 1, having at least a second enable signal and at least a second digital signal, and further comprising at least a second digitally-controlled clock generator, wherein the at least a second digitally-controlled clock generator generates at least a second clock signal in response to the second enable signal and the second digital signal.

3. An all-digital clock generator according to claim 2, wherein the processing unit comprises:
   a multiplexer receiving a plurality of input signals and a selection signal, and selecting one of the plurality of input signals to form the reference signal according to the selection signal;
   a time-to-digital converting module digitizing the period to generate the quantized signal in response to the reference signal; and
   a control unit having the first frequency multiplier, and generating the first enable signal and the first digital signal according to the reference signal, the first frequency multiplier, the quantized signal and the first clock signal, wherein the control unit further has at least a second frequency multiplier, and generates the at least a second enable signal and the at least a second digital signal according to the reference signal, the second frequency multiplier, the quantized signal and the second clock signal.

4. An all-digital clock generator according to claim 3, wherein the time-to-digital converting module comprises:
   a clock regenerator generating a third clock signal in response to the reference signal, wherein the reference signal has a first characteristic time point and a second characteristic time point to define the period, the third clock signal has a pulse having a pulse duration, and the pulse duration starts at the first characteristic time point and stops at the second characteristic time point; and
   a time-to-digital converter digitizing the pulse duration to generate the quantized signal in response to the third clock signal, wherein the quantized signal includes a quantized value.

5. An all-digital clock generator according to claim 4, wherein the time-to-digital converter comprises:
   an oscillation unit generating an oscillation signal in response to the third clock signal; and
   a quantizing unit generating a cycle-counting signal in response to the oscillation signal, sampling the oscillation signal to generate a data signal in response to the third clock signal, and digitizing the pulse duration according to the cycle-counting signal and the data signal.

6. An all-digital clock generator according to claim 4, wherein the control unit comprises:
   a divider generating a quotient signal, wherein:
      the quotient signal includes a first quotient and at least a second quotient respectively corresponding to the first frequency multiplier and the at least a second frequency multiplier,
      the divider performs a first division operation according to the quantized value and the first frequency multiplier for generating the first quotient, and performs at least a second division operation according to the quantized value and the second frequency multiplier for generating the second quotient,
      the first frequency multiplier and the second frequency multiplier are a first divisor and a second divisor, respectively; and
      the quantized value serves as a dividend for the first divisor and the second divisor;
   a decoder generating the first digital signal and the at least a second digital signal according to the quotient signal, wherein the first quotient and the second quotient correspond to the first digital signal and the second digital signal, respectively; and
   a counter generating the first enable signal according to the reference signal, the first frequency multiplier and the first clock signal, and generating the at least a second enable signal according to the reference signal, the second frequency multiplier and the second clock signal.

7. An all-digital clock generator according to claim 6, wherein:
   the divider includes a plurality of shift registers; and
   the first frequency multiplier and the second frequency multiplier are a first exponentiation 2N1 and a second exponentiation 2N2, respectively, wherein N1 and N2 are a first positive integer and a second positive integer, respectively.

8. An all-digital clock generator according to claim 6, wherein:
   the reference signal has a first reference edge and a second reference edge lagged behind the first reference edge by the period;
   the counter, in response to the first reference edge, causes the first enable signal to have an enable level so that the first digitally-controlled clock generator makes a first series of level oscillations, and causes the counter to begin to count the first clock signal;
   the counter counts the first clock signal from the first reference edge to determine a period number;
   the counter causes the first enable signal to have a disable level when the period number reaches the first frequency multiplier, wherein the disable level causes the first digitally-controlled clock generator to stop the first series of level oscillations;
   the counter causes the first digitally-controlled clock generator to renew a second series of level oscillations when the second reference edge appears in the reference signal; and
   the counter restarts to count the first clock signal in response to the second reference edge.

9. An all-digital clock generator according to claim 1, wherein the first digital signal includes a plurality of binary signals, and the first digitally-controlled clock generator comprises:
   a signal generating unit generating a second clock signal in response to the first enable signal and a first signal;
   a plurality of delay control units, in response to the second clock signal and the plurality of binary signals, determining whether the respective second clock signal passes through the plurality of respective delay control units for forming the first signal; and
   a NOT gate generating the first clock signal in response to the second clock signal.

10. A time-to-digital converter, comprising:
   an oscillation unit generating an oscillation signal in response to a first clock signal, wherein the first clock signal has a characteristic time interval; and
   a quantizing unit generating a cycle-counting signal in response to the oscillation signal, sampling the oscillation signal to generate a data signal in response to the first clock signal, and digitizing the characteristic time interval according to the cycle-counting signal and the data signal.

11. A time-to-digital converter according to claim 10, applied to an all-digital clock generator, wherein the oscillation signal includes a second clock signal and a third clock signal, and the oscillation unit comprises:
a delay module generating the third clock signal in response to the first clock signal and a feedback signal, wherein the third clock signal includes a plurality of clock sub-signals, and the plurality of clock sub-signals include a first clock sub-signal and at least a second clock sub-signal; and
a latch unit generating the feedback signal and the second clock signal in response to an enable signal and the second clock sub-signal.

12. A time-to-digital converter according to claim 11, wherein the delay module comprises:
a first delay unit performing a logical AND operation according to the feedback signal and the first clock signal for generating the first clock sub-signal; and
at least a second delay unit performing at least a logical OR operation in response to the first clock sub-signal and a predetermined-level signal for generating the second clock sub-signal.

13. A time-to-digital converter according to claim 12, wherein:
the predetermined-level signal is a low-level signal;
the latch unit includes a D latch having an enable control terminal, a data input terminal, a data output terminal and an inverting data output terminal, wherein the enable control terminal receives the enable signal, the data input terminal receives the second clock sub-signal, the data output terminal transmits the second clock signal, and the inverting data output terminal transmits the feedback signal;
the first clock signal further has two neighboring edges, and the characteristic time interval is a period between the two neighboring edges;
any two selected from a group consisting of the second clock signal and the plurality of clock sub-signals have a phase difference therebetween; and
the first delay unit, the second delay unit and the latch unit have a path thereamong, and are connected in series through the path.

14. A time-to-digital converter according to claim 13, wherein:
the data signal includes a plurality of binary signals;
the first clock signal further has a pulse, wherein the pulse has the two neighboring edges and a pulse duration, and the characteristic time interval is the pulse duration;
the cycle-counting signal is generated according to the second clock signal;
the plurality of clock sub-signals are simultaneously sampled according to the first clock signal for generating the plurality of respective binary signals; and
the characteristic time interval is digitized to generate a quantized signal according to the cycle-counting signal and the data signal.

15. A digitally-controlled clock generator, comprising:
a signal generating unit generating a first clock signal in response to a first signal; and
a plurality of delay control units each receiving a respective binary signal and, in response to the first clock signal and the plurality of respective binary signals, respectively performing a plurality of logical AND operations to determine whether the first respective clock signal passes through the plurality of respective delay control units for forming the first signal.

16. A digitally-controlled clock generator according to claim 15, applied to an all-digital clock generator, wherein:
the first clock signal is generated further in response to an enable signal;
the first signal includes a plurality of sub-signals;
the plurality of sub-signals are one of same sub-signal and different sub-signals;
the enable signal determines a first time interval and a second time interval being selective and adjacent to the first time interval, wherein the first clock signal is level-oscillatory in the first time interval and is level-stable in the second time interval; and
each of the plurality of delay control units receives the first clock signal, and the plurality of delay control units receive the plurality of binary signals, respectively, and respectively perform the plurality of logical AND operations according to the first clock signal and the plurality of respective binary signals for respectively generating the plurality of sub-signals, wherein the plurality of sub-signals include a first sub-signal and at least a second sub-signal.

17. A digitally-controlled clock generator according to claim 16, wherein the signal generating unit comprises:
a delay module generating a second signal in response to the first signal; and
a first delay unit performing a logical NAND operation according to the enable signal and the second signal for generating the first clock signal.

18. A digitally-controlled clock generator according to claim 17, wherein the delay module comprises:
a second delay unit performing a first logical OR operation in response to a third signal and the first sub-signal for generating a fourth signal; and
at least a third delay unit having a fifth signal associated with the fourth signal, and performing a second logical OR operation in response to the fifth signal and the second sub-signal for generating the second signal.

19. A digitally-controlled clock generator according to claim 18, wherein:
the third signal is a low-level signal; and
the second delay unit, the third delay unit and the first delay unit have a path thereamong, and are connected in series through the path.

20. A digitally-controlled clock generator according to claim 15, further comprising a NOT gate, wherein the NOT gate generates a second clock signal in response to the first clock signal.

* * * * *